(12) United States Patent
Park et al.

(10) Patent No.: US 7,098,903 B2
(45) Date of Patent: Aug. 29, 2006

(54) FLAT PANEL DISPLAY DEVICE

(75) Inventors: Jin-Ho Park, Suwon (KR); Jin-Hyeok Park, Seongnam (KR); Oh-Jong Kwon, Suwon (KR); Hyoung-Bae Choi, Seoul (KR); Jung-Tae Kang, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 108 days.

(21) Appl. No.: 09/950,613

(22) Filed: Sep. 13, 2001

(65) Prior Publication Data

US 2002/0075253 A1   Jun. 20, 2002

(30) Foreign Application Priority Data

Dec. 15, 2000   (KR) ............... 2000-76947

(51) Int. Cl.
*G09G 5/00*   (2006.01)

(52) U.S. Cl. ............... 345/211; 345/87; 345/212

(58) Field of Classification Search ............... 345/87, 345/92–95, 98, 100, 101–102, 204, 206, 345/211–214, 660, 905; 349/106
See application file for complete search history.

(56) References Cited

U.S. PATENT DOCUMENTS

| | | | | |
|---|---|---|---|---|
| 5,583,529 | A * | 12/1996 | Satou | 345/87 |
| 6,307,530 | B1 * | 10/2001 | Cho | 345/87 |
| 6,327,000 | B1 * | 12/2001 | Auld et al. | 348/441 |
| 6,356,260 | B1 * | 3/2002 | Montalbo | 345/204 |
| 6,437,764 | B1 * | 8/2002 | Suzuki et al. | 345/87 |
| 6,480,180 | B1 * | 11/2002 | Moon | 345/98 |
| 6,535,217 | B1 * | 3/2003 | Chih et al. | 345/519 |
| 6,535,264 | B1 * | 3/2003 | Imabayashi et al. | 349/155 |
| 6,545,688 | B1 * | 4/2003 | Loveridge et al. | 345/660 |
| 2004/0036708 | A1 * | 2/2004 | Evanicky et al. | 345/691 |

* cited by examiner

*Primary Examiner*—Ricardo Osorio
*Assistant Examiner*—Mansour M. Said

(57) ABSTRACT

Disclosed is a flat panel display device which comprises a power supply unit provided on a first PCB and supplying the power; an image driver provided on a second PCB and controlling predetermined images to be displayed; and a signal processor provided on a third PCB, connected to the image driver via a differential signal interface, converting the image signals provided from the outside into a format of signals that fits the flat panel display panel, and providing the converted signals to the image driver. The present invention reduces the EMI.

11 Claims, 3 Drawing Sheets

FLAT PANEL DISPLAY DEVICE

BACKGROUND OF THE INVENTION (a) Field of the Invention

The present invention relates to a flat panel display device. More specifically, the present invention relates to a flat panel display device for various input signals providing an optimized configuration of integration, structure and production of the flat panel display device.

(b) Description of the Related Art

In the 1990's, production of display devices such as CRTs, LCDs, PDPs and ELs became very competitive, developing markets and prototypes.

For example, the LCD is generally used for portable screens of under 13" and the CRT for a monitor screen of 15 to 20" at present, but it is supposed that these other devices will compete with the TFT LCD, and the CRT will continuously take the lead in the market of television sets of 20 to 30". But if the display features and process of Plasma Addressed LCD (PALCD) or TFT LCD become advantageous to users, the situation may change. Also, in the display market of screens of 30 to 40 inches, the CRT and PDP will compete, and in the display market of screens of over 40 inches, conventional type PDPs, projection type LCD projectors, CRT projectors and DMD projectors will compete.

Also, the inorganic ELs have military instrument markets, the LCDs have indoor and interactive display markets, and the organic ELs and FEDs are being researched as next generation display devices.

As described above, the display device markets are gradually switching to flat panel display devices with larger screens and slimmer thickness.

The LCD monitor, which is an example of common flat display devices, comprises an LCD module, an inverter for providing back light, and a signal processing printed circuit board (PCB) for receiving analog R, G and B signals, video signals such as NTSC and digital signals such as the transition minimized differential signaling (TDMS) signals, and performing signal processing such as scaling and on screen display (OSD) functions.

However, since the signals are transmitted between the PCB and the inter-board via the TTL signal method, EMI problems occur. Particularly, since high-speed signals are transmitted between a signal processing PCB and an LCD control PCB, and because of differences of common ground levels of the different PCBs, the LCD monitor has an EMI problem.

To solve the above-noted problems, data are transmitted between the signal processing PCB and the LCD control PCB via the low voltage differential signal (LVDS) method, and a shield process and a ferrite core are provided, but these increase production costs.

Further, a power generation block is divided into an image driving power generator, a scaler power generator and a back light driving inverter and each of them is installed on respective PCB blocks, and since the power is supplied to the scaler power generator and then to an inner analog/digital converter or to the image driving power generator, a very high current flows via a cable, which renders the device vulnerable to the EMI.

In addition, since the power generation blocks are scattered on the respective PCB blocks and there is a lot of data transmission between the PCB blocks, many functions are repeated.

Also, since the PCB blocks include three units, digital signals and driving power connections are increased and therefore the cost for solving EMI problems increases. In other words, an additional unit for installing three PCBs and EMI shielding increases the thickness and weight of the product and limits the product design.

SUMMARY OF THE INVENTION

It is an object of the present invention to provide a flat panel display device having an optimized structure and processing of various input signals.

In one aspect of the present invention, a flat panel display device comprises a power supply unit provided on a first printed circuit board (PCB) and supplying power; an image driver provided on a second PCB and controlling predetermined images to be displayed; and a signal processor provided on a third PCB, connected to the image driver via a differential signal interface, converting image signals provided from the outside into a format of signals that fits the flat panel display panel, and providing the converted signals to the image driver.

The signal processor comprises: at least one interface receiving graphic information from the outside and outputting digital graphic signals; a scaling controller converting the digital graphic signals so as to be applied to environments of the image driver and outputting the converted digital graphic signals; and a timing controller providing the converted digital graphic signals to the image driver.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustrating the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
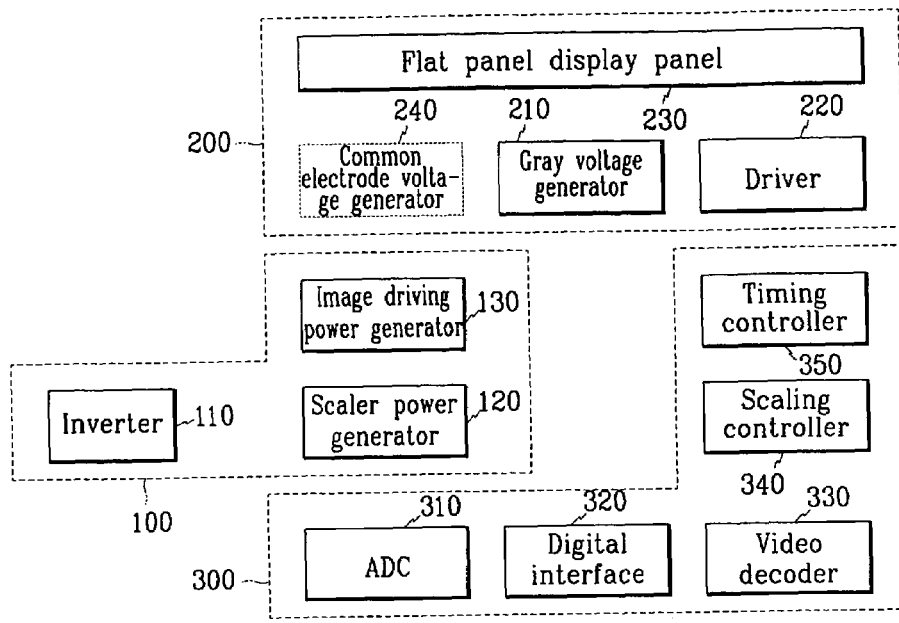
FIGS. 1 and FIG. 2 show a flat panel display device according to a first preferred embodiment of the present invention. The flat panel display device comprises an inverter and power PCB unit 100, an image driving PCB unit 200 and a signal processing PCB unit 300.

FIG. 1 shows a flat panel display device according to a first preferred embodiment of the present invention.

Referring to FIG. 1, the flat panel display device according to a first preferred embodiment of the present invention comprises an inverter and power PCB unit 100, an image driving PCB unit 200 and a signal processing PCB unit 300.

The inverter and power PCB unit 100 comprises an inverter 110, a scaler power generator 120 and an image driving power generator 130, and it controls the power supplied from the outside and supplies analog and digital power to the image driving PCB unit 200 and the signal processing PCB unit 300.

The image driving PCB unit 200, separated from the inverter and power PCB unit 100, comprises a gray voltage generator 210, a driver 220 and a flat panel display panel 230, and displays predetermined images according to the signals provided by the signal processing PCB unit 300. If the flat panel display panel is a liquid crystal display device, the image driving PCB unit 200 further comprises a common electrode voltage generator 240 for generating the common electrode voltage Vcom of the liquid crystal.

The signal processing PCB unit 300, separated from the inverter and power PCB unit 100 and the image driving PCB unit 200, comprises an analog/digital converter 310, a digital interface 320, a video decoder 330, a scaling controller 340 and a timing controller 350. At this time, the image processing PCB unit 300, the inverter and power PCB unit 100 and the image driving PCB unit 200 are positioned on an identical plane.

When the image signals are provided, the signal processing PCB unit 300 provides a power supply instruction signal to the inverter and power PCB unit so as to control ON/OFF operations of the image driving PCB unit 200, and converts the image signals into signals adequate for the flat panel display panel and provides the converted image signals to the image driving PCB unit 200.

Figure 2:
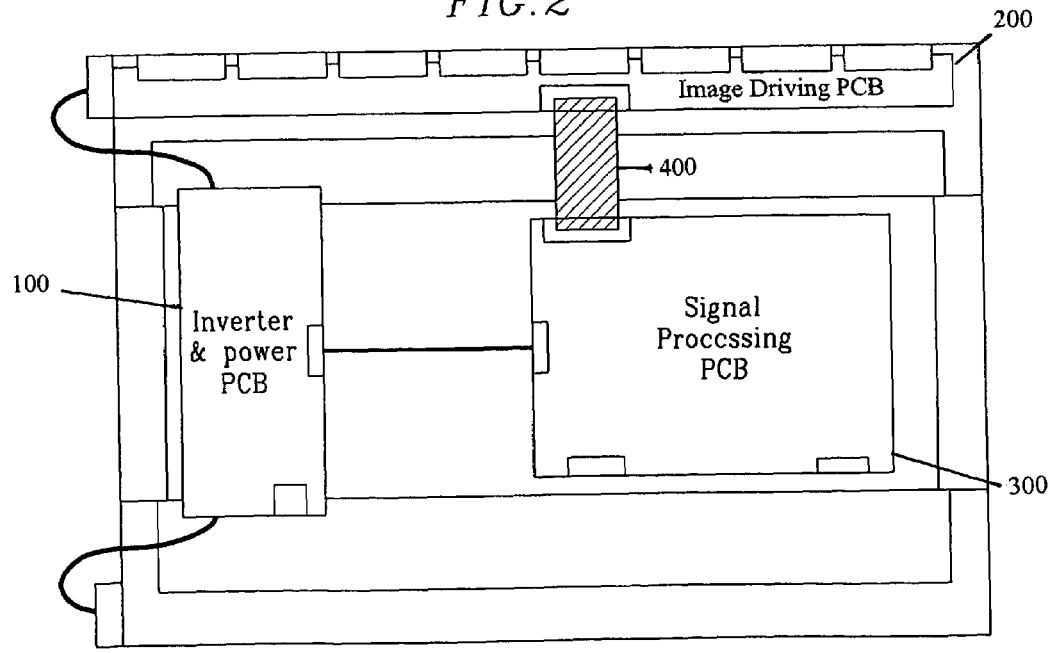

Here, as shown in FIG. 2, the image driving PCB unit 200 and the signal processing PCB unit 300 are connected via a differential signal interface 400. One end of the differential signal interface 400 can be connected to the image driving PCB unit 200 and the other end of the same to the signal processing PCB unit 300 via a predetermined connector. Obviously, the one end of the differential signal interface 400 can be connected to the image driving PCB unit 200 via a connector.

A reduced swing differential signal (RSDS) method can be used for the differential signal interface 400. The RSDS method, a digital interface technique developed by the US National Semiconductor company, consumes less power compared to the conventional TTL bus interface techniques and reduces the generation of the EMI problem caused by low noise.

Referring to FIG. 2, since an inverter for generating the backlighting driving power and a power supply for driving the flat panel display device are integrated into a single unit, the high current can be restricted within a single PCB circuit, thereby reducing the EMI.

Also, since the inverter and power PCB for supplying the power is separated from the signal processing PCB, the sizes and resolutions of the flat panel display panel can be easily modified.

Since the signal processor unit that is a main source of generating EMI noises is integrated on a single signal processing PCB, the EMI problem can be easily handled. Thus, analog interface, video interface or digital interface can be designed by combination of interfaces according to the flat panel display product. Also, this method enables mass production easier and satisfies various customer requirements.

Regarding the connection between the signal processing PCB and the image driving PCB, the differential signal interface 400,(e.g., RSDS technique) reduces the EMI problem and the operation timing.

The easy connectivity between the signal processing PCB and the image driving PCB makes block designs possible. In the conventional TTL connection method, two flexible printed circuits (FPC) are used, but in the present invention, a single FPC can be used thanks to the RSDS technique.

Only the common electrode voltage generator and the gray voltage generator that need panel features and matching, are arranged on the image driving PCB to implement the block design.

As described above, in the preferred embodiment of the present invention, since the power supplying PCB unit, the signal processing PCB unit and the PCB unit that controls the flat panel display panel drive and the image signal display are provided separately, the radio frequency digital signals and the high current are individually applied to different PCBs, thereby reducing the EMI.

An implementation of a flat panel display device to be applied to monitors or television sets will now be described.

Figure 3:
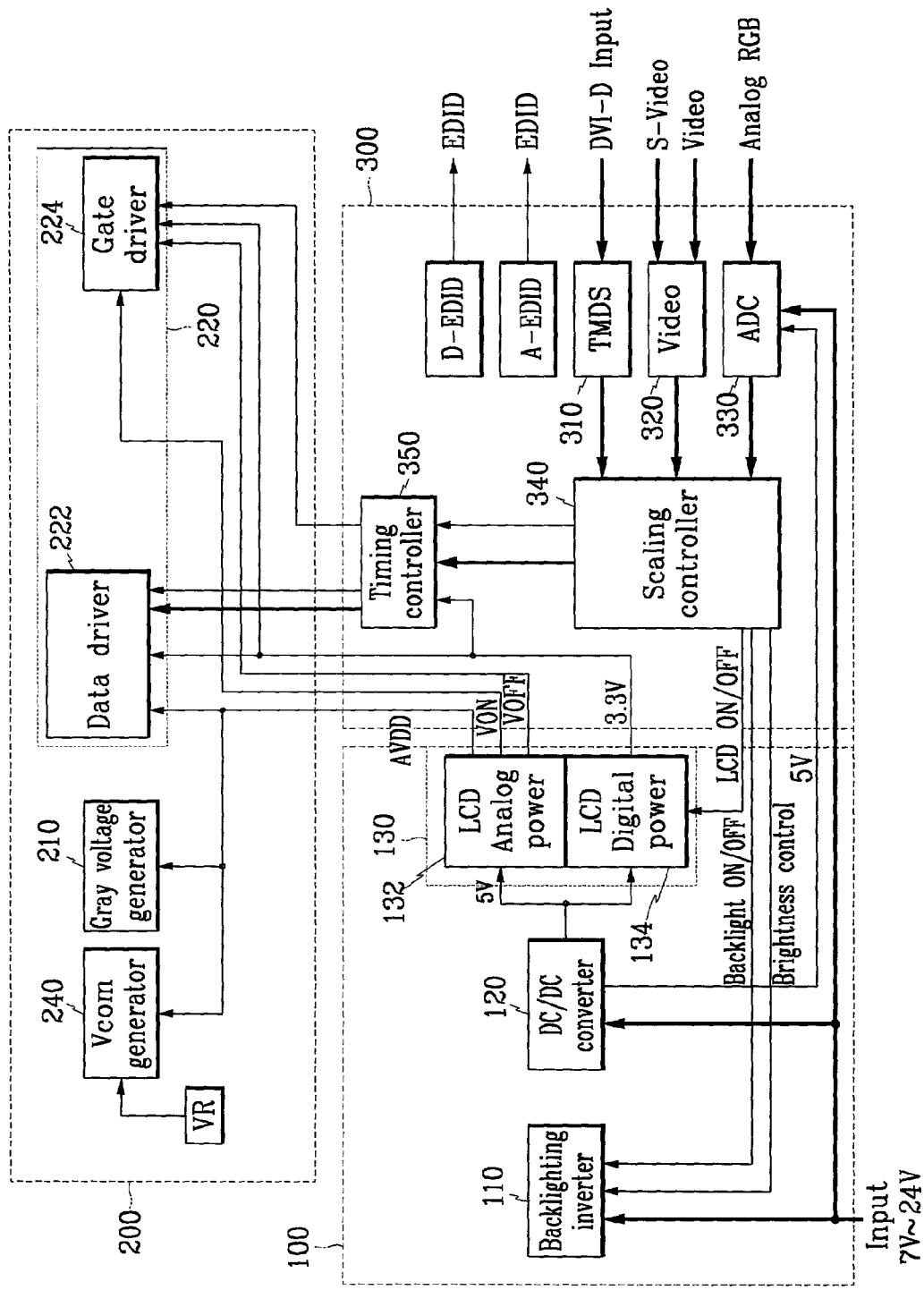
FIG. 3 shows block diagram of the flat panel display device according to the first preferred embodiment of the present invention.

FIG. 3 shows a block diagram of the flat panel display device according to the first preferred embodiment of the present invention.

Referring to FIG. 3, the flat panel display device which is a liquid crystal display, comprises a power supply 100, an image driver 200 and a signal processor 300. Here, the flat panel display device can be used as a monitor or a television screen after a modification by monitor or TV manufacturers.

The power supply 100 comprises a backlighting inverter 110, a DC/DC converter 120 and a power generator 130, and controls the power supplied from outside by a step down method, and provides the analog and digital power respectively to the image driver 200 and the signal processor 300.

In detail, the backlighting inverter 110 receives the DC power of 7 to 12 volts (V) from the outside, converts the same into 12V power and supplies the 12V power to a backlighting driver (not illustrated).

The DC/DC converter 120 receives DC power of 7 to 24V from the outside, reduces the power level and provides 5V DC power to the power generator 130.

The power generator 130 comprises an LCD analog power generator 132 and an LCD digital power generator 134, and receives the 5V DC power from the DC/DC converter 120, supplies the analog and digital power for driving the image driver 200 according to LCD ON/OFF switching signals provided by the signal processor 300 to the image driver 200, and also supplies the power for driving the signal processor 300.

At this time, the LCD analog power generator 132 receives the 5V DC power from the DC/DC converter 120, and when the LCD ON switching signal is input from the signal processor 300, provides the analog driving power and image driving power to the image driver 200.

The LCD digital power generator 134 receives the 5V DC power from the DC/DC converter 120, and when the LCD ON switching signal is input from the signal processor 300, provides the DC power, preferably 3.3V DC power, to the image driver 200 and the signal processor 300.

The image driver 200 comprises a gray voltage generator 210, a liquid crystal display unit 220 including a data driver 222 and a gate driver 224, and a common electrode voltage generator 240. The image driver 200 receives the analog power and the digital power from the power supply 100 and displays images.

In detail, the gray voltage generator 210 receives the analog driving power from the LCD analog power generator 132, and a predetermined voltage of preferably 3.3V from the LCD digital power generator 134, and a column control signal from the signal processor 300, and then the gray voltage generator 210 starts to be driven.

The gate driver 224 receives control signals from the signal processor 300 and TFT pixel ON/OFF power from the LCD digital power generator 134, and then the gate driver 224 starts to be driven.

The common electrode power generator 240 outputs the common electrode voltage Vcom that is a reference value of conversion of the electrodes of the liquid crystal positioned on the liquid crystal display panel 220 to the liquid crystal display panel 220, and in the case the LCD uses the high voltage driving method, the common electrode can be DC power, but in the case the LCD uses the low voltage driving method, the common electrode can be the power having a predetermined period, preferably a power which has a single frame of the image signals as a period and repeats the high levels and low levels.

The signal processor 300 comprises a transition minimized differential signaling (TMDS) interface 310 for receiving digital visual interface data (DVI-D) input signals from the outside, a video interface 320 for receiving video signals or super video signals from the outside, an ADC 330 for receiving analog red, green and blue signals, converting the signals and outputting the same, a scaling controller 340 for processing the digitalized signals, converting the same into signals that satisfy the LCD panel, and outputting the signals, and a timing controller 350.

The scaling controller 340 processes the digitized signals provided by the TMDS interface 310, the video interface 320 and the ADC 330, and converts the signals into signals required by the LCD panel.

The conventional LCD panel displays signals of single frequency bands. When the LCD panel is used for a desktop computer and not for a notebook computer, however, a device for converting signals of various frequency bands into formats of the LCD panel is necessary. The above-noted scaling controller performs this function. Without the scaling controller, if the signals of low-resolution are displayed on the high-resolution panel, the signals are not displayed on the whole screen area but on a part of the screen.

Therefore, in order to adjust the screen area, the scaling controller performs a simple interpolation method by adjusting the number of samplings in the horizontal direction and repeating the lines in the perpendicular direction.

Also, in order to adjust the screen area in a different manner, when a block of a predetermined size is set to be a unit and the total blocks are referred, new pixels can be made unlike the addition of pixels or lines as described above.

Figure 4:
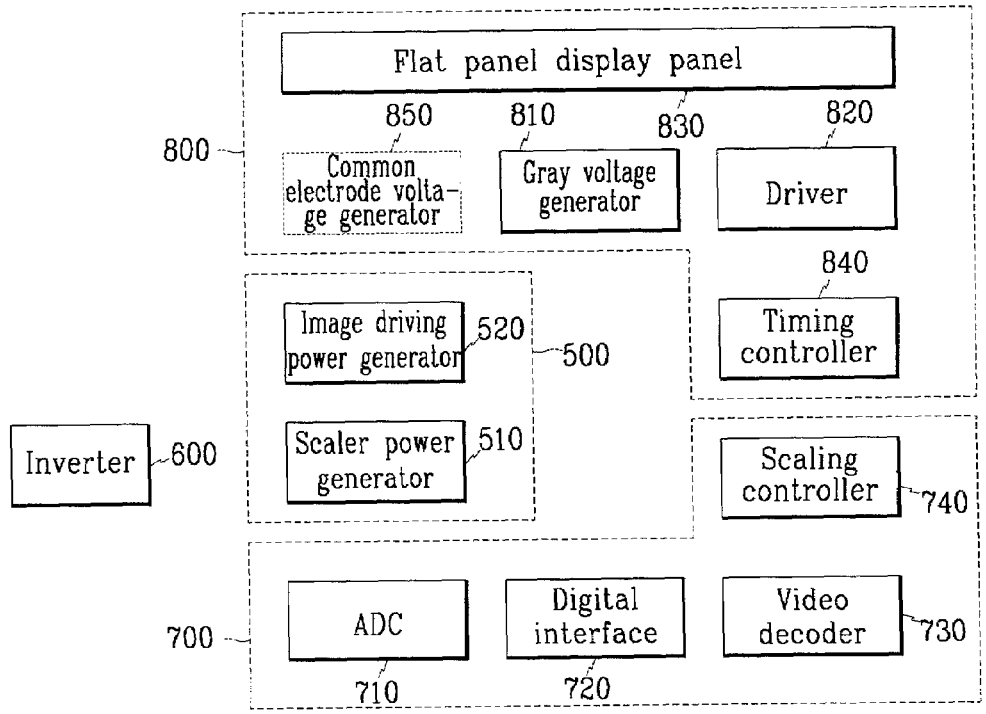
FIG. 4 shows block diagram of the flat panel display device according to a second preferred embodiment of the present invention.

FIG. 4 shows a block diagram of the flat panel display device according to a second preferred embodiment of the present invention.

Referring to FIG. 4, the flat panel display device according to the second preferred embodiment of the present invention comprises a power PCB unit 500, an inverter PCB unit 600, a signal processing PCB unit 700 and a driving and control PCB unit 800.

The power PCB unit 500 comprises a scaler power generator 510 and an image driving power generator 520. It controls the power supplied from the outside and supplies the analog power and the digital power respectively to the inverter PCB unit 600, the signal processing PCB unit 700 and the driving and control PCB unit 800.

The inverter PCB unit 600 and the power PCB unit are installed separately, and the inverter PCB unit 600 is driven according to the power supplied by the power PCB unit 500 and then drives the backlight positioned on the rear side of the LCD panel.

The signal processing PCB unit 700, the power PCB unit 500 and the inverter PCB unit 600 are installed separately. The signal processing PCB unit 700 includes an ADC 710, a digital interface 720, a video decoder 730 and a scaling controller 740. When the image signals are provided from the outside, the signal processing PCB unit 700 provides a power supply instruction signal to the inverter PCB unit 600 and the power PCB unit 500 so as to control the ON/OFF operation of the driving and control PCB unit 800. Then, it converts the image signals into signals proper for the flat panel display panel, and provides the signals to the driving and control PCB unit 800.

The driving and control PCB unit 800, the power PCB unit 500, the inverter PCB unit 600 and the signal processing PCB unit 700 are installed separately. The driving and control PCB unit 800 comprises a gray voltage generator 810, a driver 820, a flat panel display panel 830 and a timing controller 840. It displays predetermined images. If the flat panel display panel is an LCD, the driving and control PCB unit 800 further comprises a common electrode voltage generator 850 for generating the common electrode voltage Vcom.

As described above, in the second preferred embodiment, since the inverter for supplying the power to the backlight unit, the power supply PCB unit, the signal processing PCB unit, and the PCB unit for controlling the flat panel display panel drive and the image signal display are separately provided, the radio-frequency digital signals and the high current are restricted to each of the PCBs, thereby reducing the EMI.

Figure 5:
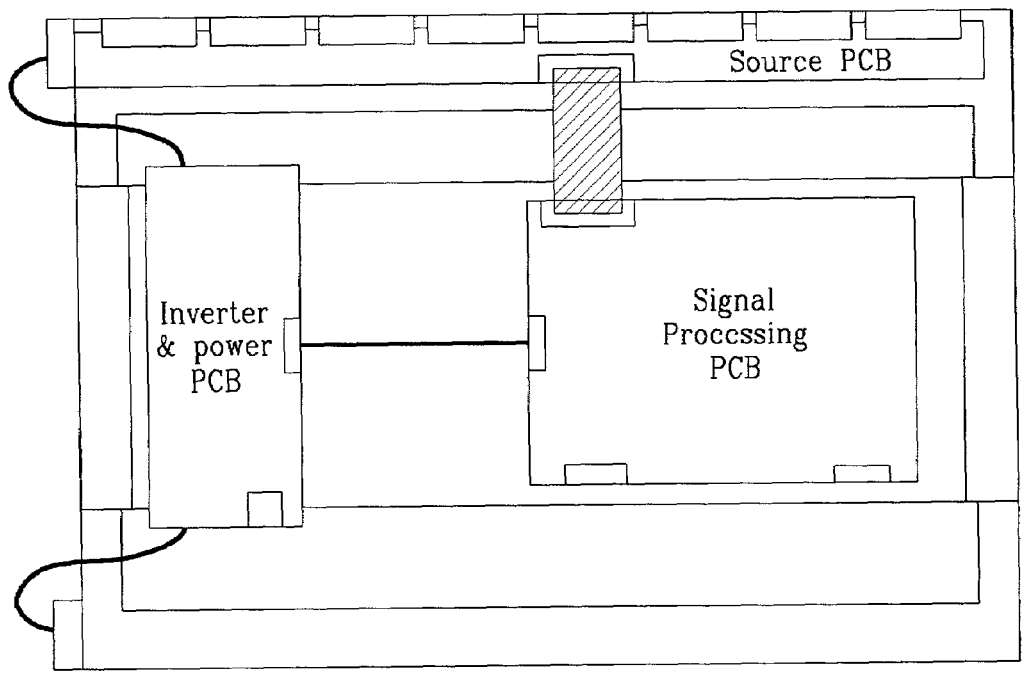
FIG. 5 shows an arrangement plan of the flat panel display device according to the second preferred embodiment of the present invention.

FIG. 5 shows an arrangement plan of the flat panel display device according to the second preferred embodiment of the present invention.

Referring to FIG. 5, since the power PCB positioned on the rear side of the flat panel display panel, preferably the LCD, and the inverter PCB for driving the backlight of the LCD are separately provided, the modifications of the size and resolution of the flat panel display panel can be flexible.

Since the signal processing PCB that causes the EMI problem is integrated on a single PCB, the EMI problem can be easily handled. Also, the analog interface, digital interface or the video interface can be combined according to final product specification, rendering mass production feasible. Thus the preferred embodiment can easily satisfy the rendering various customer requirements.

Also, the signal processing PCB and the data (or source) PCB are connected using the differential signal interface, preferably the RSDS technique, the EMI and timing problems can be improved.

Furthermore, by connecting the signal processing PCB and the data PCB using a simple connector, block design can be easily implemented. It should be noted that the data PCB include the common electrode voltage generator and the gray voltage generator that need to be matched with a specific LCD panel type, in order to implement a block design.

As described above, in the second preferred embodiment of the present invention, the power supply PCB unit, the signal processing PCB unit and the PCB unit for controlling the driving of the flat panel display panel and displaying of the image signals are separately provided and configured. This can restrict the RF digital signals and the high current on the respective PCBs, thereby reducing the EMI.

In the above-described embodiments of the present invention, the LCD is used as the display device, but other flat panel display devices such as the PDP, FED and EL can also be used.

The signal processing and power functions are implemented on different PCBs, minimizing the repeated functions. This also enables to integrate similar functions and optimize the total function.

When compared to the configuration of the conventional flat panel display device, the reduced connections between the PCBs can save the cost of connection cables.

The power unit, the signal processor and the image driver arranged on the identical flat panel display device saves the weight and sheds the thickness of the display device can a lot.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A flat panel display device, comprising: a first printed circuit board (PCB) having a power supply unit; a second PCB having an image driver; and a third PCB having a signal processor, which is connected to the image driver via a differential signal interface, converting externally provided image signal into a format of signals proper for the flat panel display panel, and providing the converted signals to the image driver, wherein the image driver is driven by power supplied from the power supply unit and comprises: a common electrode voltage generator; a gray voltage generator; a data driver for outputting data signals; and a gate driver for outputting gate signals.

2. The device of claim 1, wherein the signal processor comprises:
   at least one interface receiving graphic information from outside and outputting digital graphic signals;
   a scaling controller converting the digital graphic signals to meet specifications of the image driver and outputting the converted digital graphic signals; and
   a timing controller providing the converted digital graphic signals to the image driver.

3. The device of claim 1, further comprising:
   a liquid crystal display panel for receiving the data signals and the gate signals and displaying images; and
   a backlighting unit provided on the rear side of the liquid crystal display panel.

4. The device of claim 3, wherein the power supply unit converts externally supplied power and generates analog type power and digital type power,
   wherein the converted power is supplied to the backlight unit,
   wherein the analog type power is supplied to a liquid crystal display module, and
   wherein the digital type power is supplied to the signal processor and the liquid crystal display module.

5. The device of claim 1, wherein the power supply unit, the image driver and the signal processor are provided on an identical plane of the rear side of the flat panel display device.

6. The device of claim 1, wherein the differential signal interface is a reduced swing differential signal (RSDS) method.

7. A flat panel display device, comprising:
   a first power supply unit provided on a first printed circuit board (PCB) and supplying at least one first power;
   a second power supply unit provided on a second PCB and supplying at least one second power;
   an image driver provided on a third PCB and controlling display of images; and
   a signal processor provided on a fourth PCB, connected to the image driver via a differential signal interface, converting externally provided image signals into a format of signals proper for the flat panel display panel, and providing the converted signals to the image driver.

8. The device of claim 7, wherein the signal processor comprises:
   at least one interface receiving graphic information from outside and outputting digital graphic signals;
   a scaling controller converting the digital graphic signals to meet specifications of the image driver and outputting the converted digital graphic signals; and
   a timing controller providing the converted digital graphic signals to the image driver.

9. The device of claim 7, wherein the image driver driven by the first power composes:
   a common electrode voltage generator;
   a gray voltage generator;
   a data driver for outputting data signals;
   a gate driver for outputting gate signals;
   a liquid crystal display panel for receiving the data signals and the gate signals and displaying images; and
   a backlighting driver that is provided on the rear side of the liquid crystal display panel and is driven by the second power.

10. The device of claim 7, wherein the first power supply unit and the second power supply unit, the image driver and the signal processor are provided on an identical plane of the rear side of the flat panel display device.

11. The device of claim 2, wherein the differential signal interface is a reduced swing differential signal (RSDS) method.

* * * * *